(12) United States Patent
Döllgast et al.

(10) Patent No.: US 11,101,426 B2
(45) Date of Patent: Aug. 24, 2021

(54) PIEZOELECTRIC TRANSFORMER

(71) Applicant: EPCOS AG, Munich (DE)

(72) Inventors: Bernhard Döllgast, Deutschlandsberg (AT); Franz Rinner, Deutschlandsberg (AT); Pavol Kudela, Deutschlandsberg (AT)

(73) Assignee: EPCOS AG, Munich (DE)

( * ) Notice: Subject to any disclaimer, the term of this patent is extended or adjusted under 35 U.S.C. 154(b) by 739 days.

(21) Appl. No.: 15/775,805

(22) PCT Filed: Nov. 8, 2016

(86) PCT No.: PCT/EP2016/076995
§ 371 (c)(1),
(2) Date: May 11, 2018

(87) PCT Pub. No.: WO2017/081015
PCT Pub. Date: May 18, 2017

(65) Prior Publication Data
US 2018/0331277 A1 Nov. 15, 2018

(30) Foreign Application Priority Data
Nov. 13, 2015 (DE) .......................... 102015119656.5

(51) Int. Cl.
*H01L 41/107* (2006.01)
*H01L 41/047* (2006.01)
(Continued)

(52) U.S. Cl.
CPC ........ *H01L 41/107* (2013.01); *H01L 41/0471* (2013.01); *H05H 1/24* (2013.01); *H01L 41/0836* (2013.01); *H05H 2001/2481* (2013.01)

(58) Field of Classification Search
CPC combination set(s) only.
See application file for complete search history.

(56) References Cited

U.S. PATENT DOCUMENTS 6,366,006 B1 * 4/2002 Boyd .................... H01L 41/107
310/359
9,788,404 B2 * 10/2017 Nettesheim .............. H05H 1/24
(Continued)

FOREIGN PATENT DOCUMENTS

DE  102005032890 B4  1/2009
DE  102008054556 A1  6/2010
(Continued)

OTHER PUBLICATIONS

Itoh, H. et al., "Discharge Plasmas Generated by Piezoelectric Transformers and their Applications," Plasma Sources Science and Technology, Institute of Physics Publishing, vol. 15, 10 pages.

*Primary Examiner* — Bryan P Gordon
(74) *Attorney, Agent, or Firm* — Slater Matsil, LLP

(57) ABSTRACT

A piezoelectric transformer is disclosed In an embodiment a piezoelectric transformer includes a cylindrical base body with an input region and an output region, wherein a cylinder axis of the base body extends in a longitudinal direction, wherein the input region is configured to convert an AC voltage into a mechanical vibration, wherein the output region is configured to convert a mechanical vibration into an electrical voltage, wherein the output region includes a single piezoelectric layer polarized in the longitudinal direction, wherein, in the input region, a first piezoelectric layer, on which a first internal electrode is arranged, and a second piezoelectric layer, on which a second internal electrode is arranged, are wound onto one another, and wherein the first piezoelectric layer and the second piezoelectric layer are polarized in a radial direction which is perpendicular to the longitudinal direction.

11 Claims, 3 Drawing Sheets

(51) Int. Cl.
*H05H 1/24* (2006.01)
*H01L 41/083* (2006.01)

(56) References Cited

U.S. PATENT DOCUMENTS

| | | | | |
|---|---|---|---|---|
| 2002/0130592 A1* | 9/2002 | Hu | ............... | H01L 41/107 |
| | | | | 310/359 |
| 2009/0122941 A1* | 5/2009 | Engemann | ........... | H05H 1/2475 |
| | | | | 376/145 |
| 2015/0155474 A1* | 6/2015 | Tanimoto | ............ | H01L 41/0933 |
| | | | | 310/332 |
| 2017/0012556 A1* | 1/2017 | Jeong | .................... | H02M 3/337 |

FOREIGN PATENT DOCUMENTS

| | | |
|---|---|---|
| DE | 102013100617 A1 | 7/2014 |
| EP | 1062702 B1 | 5/2010 |
| EP | 1902599 B1 | 10/2011 |
| JP | S61189678 A | 8/1986 |
| JP | 11112046 A | 4/1999 |
| JP | 11266039 A | 9/1999 |
| JP | 2006156774 A | 6/2006 |
| JP | 2007281359 A | 10/2007 |
| JP | 2009501409 A | 1/2009 |
| WO | 2007006298 A2 | 1/2007 |

\* cited by examiner

- State of the art -

PIEZOELECTRIC TRANSFORMER

This patent application is a national phase filing under section 371 of PCT/EP2016/076995, filed Nov. 8, 2016, which claims the priority of German patent application 10 2015 119 656.5, filed Nov. 13, 2015, each of which is incorporated herein by reference in its entirety.

TECHNICAL FIELD

The present invention relates to a piezoelectric transformer.

BACKGROUND

A piezoelectric transformer can be employed for generating plasma, in particular a non-thermal atmospheric-pressure plasma. A piezoelectric transformer is a type of tuned transformer that is based on piezoelectricity and, in contrast to the conventional magnetic transformers, constitutes an electromechanical system.

Piezoelectric transformers are known that have a rectangular cross-section. FIG. 4 shows such a piezoelectric transformer 1 which is known in the prior art. The piezoelectric transformer 1 comprises an input region 4 and an output region 5. In the input region 4 the piezoelectric transformer 1 comprises electrodes 7, 8 to which an AC voltage can be applied. In the input region 4 this voltage is converted, as a consequence of the piezoelectric effect, into a mechanical vibration which in turn is converted into a high voltage in the output region 5.

From the publication by Ito et al.: Discharge plasmas generated by piezoelectric transformers and their applications, Plasma Sources Sci. Technol. 15 (2006), it is known that piezoelectric transformers 1 can be employed for igniting a plasma. In this publication it is described that the ignition of the plasma occurs both at the lateral longitudinal edges 15 and at the edges of the output-side end face 13.

In FIG. 4, an ignition 16 of plasma on an output-side end face 13, which faces away from the input region 4, and further ignitions 17 of plasma at the lateral edges 15 are indicated. The electrical potential is not uniformly distributed along the surface of the output region 5 but exhibits a maximum that is a few millimeters away from the output-side end face 13. Therefore, in particular, plasma ignitions 17 occur that are arranged along the edges 15 and that are offset from the end face 13 by a few millimeters.

However, in the aforementioned publication it was not recognized that these ignitions 17 at the lateral edges 15 result in back coupling, in the course of which high mechanical stresses in the piezoelectric material are generated in the output region 5, which in the operation of the piezoelectric transformer 1 may lead to cracks, as a result of which the service life of the piezoelectric transformer 1 is reduced.

Furthermore, rod-shaped piezoelectric transformers are also known. These are described in WO 2007/006298 A2 and in EP 1 062 702 B1, for instance. These transformers have an elaborate structure. In these cases a tubular transformer is described that comprises two electrodes in the output region, between which a high voltage is generated. For this purpose the output region comprises several regions that have been polarized in opposite directions relative to one another. Furthermore, an input region can be subdivided into two regions that are driven contrary to one another.

SUMMARY OF THE INVENTION

Embodiments provide an improved piezoelectric transformer that avoids the formation of stress peaks at sharp edges in the output region.

Embodiments provide a piezoelectric transformer that comprises a cylindrical base body with an input region and an output region, the cylinder axis of the base body extending in a longitudinal direction. The input region is configured to convert an applied AC voltage into a mechanical vibration. The output region is configured to convert a mechanical vibration into an electrical voltage. The output region comprises a single piezoelectric layer which has been polarized in the longitudinal direction. In the input region a first piezoelectric layer, on which a first internal electrode is arranged, and a second piezoelectric layer, on which a second internal electrode is arranged, have been wound onto one another. The first piezoelectric layer and the second piezoelectric layer have each been polarized in a radial direction which is perpendicular to the longitudinal direction.

By virtue of the cylindrical shape of the base body, a shaping is provided that does not have sharp edges. In this way, formation of stress peaks on sharp edges can be avoided in principle. Accordingly, the associated problems—such as the uncontrolled ignition of the plasma or an undesirable shift of the location of the plasma ignition away from an end face—can be avoided. Although the cylindrical main-body shape requires a somewhat more elaborate production process, at the same time it overcomes fundamental disadvantages of the known rectangular shape, so that the advantages of the cylindrical base body predominate overall.

In various embodiments No insulating layer is provided between the input region and the output region. Rather, the first and second piezoelectric layers of the input region may directly touch the piezoelectric layer of the output region. In this way it can be ensured that a mechanical vibration excited in the input region passes unattenuated into the output region, and no energy is lost.

The piezoelectric transformer can be connected to a driver circuit which is configured to apply an AC voltage to the input region. The frequency of the AC voltage in this case can be chosen in such a manner that the piezoelectric transformer is operated at its resonant frequency or at a harmonic of its resonant frequency.

In various embodiments the output region comprises a single piezoelectric layer which may have been continuously polarized in a single direction of polarization. The direction of polarization of the piezoelectric layer of the output region is the longitudinal direction. Consequently, the entire piezoelectric layer of the output region may have been polarized in a single direction. This direction is the longitudinal direction in which the cylinder axis extends. The output region is, in particular, free from partial regions that have been polarized in an opposite direction. Consequently, a simple structure of the piezoelectric transformer may result.

The output region may, in particular, be free from a counter-electrode. Accordingly, the plasma can be ignited between the output region and a neighborhood of the piezoelectric transformer.

The first internal electrode and the second internal electrode may have been helically wound in the input region. Accordingly, in the radial direction, which is perpendicular to the longitudinal direction, the first internal electrode and the second internal electrode may have been stacked above one another in alternating manner. Therefore, the input region is configured to execute a mechanical vibration in the radial direction. The input region can execute vibrations in the 31-mode.

This wound structure can be realized easily in terms of manufacturing engineering. In particular, the structure can be produced easily by means of two piezoelectric films imprinted with electrode paste, and does not require any elaborate structuring.

The piezoelectric transformer may be substantially rotationally symmetrical. By reason of the rotational symmetry, uncontrolled plasma discharges do not occur along the external surfaces that extend in the longitudinal direction.

The output region may have been configured to generate a high voltage between an end face of the input region pointing away from the output region and a neighborhood of the transformer. Accordingly, no counter-electrode may have been provided on the output region. Rather, the voltage that is capable of being generated by the piezoelectric transformer in the output region may be sufficient to ionize a process gas without the presence of a counter-electrode solely on the basis of the potential difference relative to a neighborhood of the transformer. By virtue of the fact that a counter-electrode can be dispensed with, the piezoelectric transformer can be constructed in space-saving manner.

The output region may directly adjoin the input region in the longitudinal direction. In particular, the piezoelectric transformer may be free from an insulating layer which separates the external region and the internal region. Accordingly, no electrodes are required in the external region.

The piezoelectric layer of the external region may directly adjoin the first piezoelectric layer and the second piezoelectric layer of the input region. The piezoelectric layer of the external region may in this case be adjacent in the longitudinal direction to the piezoelectric layers of the input region.

The first piezoelectric layer of the input region and the second piezoelectric layer of the input region may have been polarized in mutually opposed directions, in which case both the direction of polarization of the first piezoelectric layer and the direction of polarization of the second piezoelectric layer are radial directions which are perpendicular to the longitudinal direction. In this way, in the course of winding the layers an input region can be constructed which can be excited to bring about vibrations in the radial direction. In this case, directions that point either perpendicularly toward the cylinder axis or perpendicularly away from the cylinder axis are designated as radial directions.

The base body may have a hollow-cylindrical or a solid-cylindrical shape. The advantage of a solid-cylindrical shape is that in this case the entire volume of the base body can be utilized as piezoelectrically active layers. The advantage of a hollow-cylindrical base body consists in a particularly simple production process, in the course of which layers can be wound onto a mandrel.

The layers of the input region may have been wound in such a manner that the first internal electrode is partially exposed on an external surface of the input region and that the second internal electrode is partially exposed on an external surface of the input region. The exposed regions can in this case each be reinforced to form external electrodes of the input region. Accordingly, the piezoelectric transformer can be contacted on the exposed regions of the internal electrodes.

The arrangement described herein, in which regions of both internal electrodes are exposed on an external surface of the piezoelectric transformer, can be realized by the first and second piezoelectric layers each being formed by a film which is wound up, said films differing in their length.

The first internal electrode may comprise a region that is exposed on an external surface of the input region and that has been reinforced in its thickness. The second internal electrode may comprise a region that is exposed on an external surface of the input region and that has been reinforced in its thickness. These regions may serve as external electrodes of the piezoelectric transformer. By virtue of the reinforcement of the respective regions of the first and second internal electrodes, a sufficient solderability can be ensured. Furthermore, the reinforced regions that are exposed on the external surfaces are, by reason of their reinforcement, less sensitive to damage as a consequence of abrasion.

The piezoelectric transformer may be a transformer of the Rosen type.

A further aspect of the present invention relates to an apparatus for generating a plasma, said apparatus comprising a piezoelectric transformer described above. In this case, a process gas, for instance, can be conducted along the piezoelectric transformer and ionized by a high voltage generated at the output region of the transformer. The apparatus is designed, in particular, for generating a nonthermal atmospheric-pressure plasma.

BRIEF DESCRIPTION OF THE DRAWINGS

In the following, the present invention will be described more precisely with reference to the figures.

DETAILED DESCRIPTION OF ILLUSTRATIVE EMBODIMENTS

Figure 1:
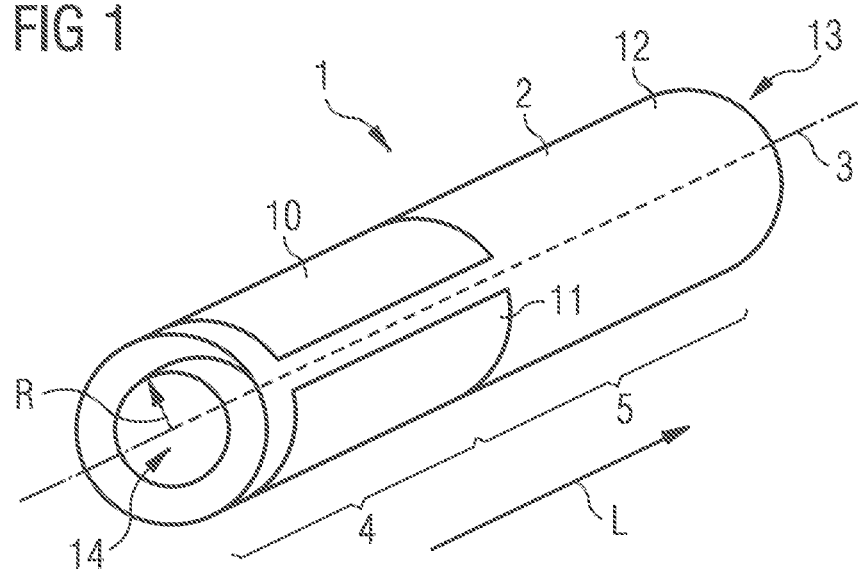
FIG. 1 shows a piezoelectric transformer in perspective view.

FIG. 1 shows a piezoelectric transformer 1 in a perspective view. The piezoelectric transformer 1 comprises a cylindrical base body 2. The base body 2 extends in a longitudinal direction L, the cylinder axis 3 being arranged in the longitudinal direction.

The base body 2 comprises an input region 4 and an output region 5. The output region 5 directly adjoins the input region 4 in the longitudinal direction L. In particular, no further insulating layers are provided between the input region 4 and the output region 5.

The piezoelectric transformer 1 is configured to convert an AC voltage that is applied to the input region 4 into a voltage that is available at the output region 5. A low voltage of, for instance, less than 25 V can be applied to the input region 4, said voltage being converted into a high voltage available at the output region 5.

The input region 4 is configured to convert an applied AC voltage into a mechanical vibration. The mechanical vibration can then propagate on the output region 5. The output region 5 is configured to convert a mechanical vibration into an electrical voltage, which here may be a high voltage.

The input region 4 comprises a first piezoelectric layer 6, on which a first internal electrode 7 is arranged. Furthermore, the input region 4 comprises a second piezoelectric layer 8, on which a second internal electrode 9 is arranged. The two piezoelectric layers 6, 8 have been helically wound, so that in a radial direction R, which is directed perpendicularly outward from the cylinder axis 3, the first internal electrode 7 and the second internal electrode 9 are arranged above one another in alternating manner.

The first piezoelectric layer 6 and the second piezoelectric layer 8 have each been polarized in a radial direction R, a direction of polarization of the first piezoelectric layer 6 being opposed to the direction of polarization of the second piezoelectric layer 8. Accordingly, the direction of polarization of one of the piezoelectric layers 6 points toward the cylinder axis 3, and the direction of polarization of the other piezoelectric layer points away from the cylinder axis 3.

If an AC voltage is now applied between the first internal electrode 7 and the second internal electrode 9, the piezoelectric layers 6, 8 are excited to bring about changes of length in the radial direction R. These changes of length propagate as mechanical waves in the longitudinal direction L and in this way arrive in the output region 5.

The first piezoelectric layer 6 and the second piezoelectric layer 8 are wound to form the input region 4 in such a manner that a region 10 of the first internal electrode 7 is exposed on an external surface of the input region 4. This region 10 of the first internal electrode 7 has been reinforced, so that it has a greater thickness than the remaining regions of the first internal electrode 7. The reinforced region 10 of the first internal electrode 7 forms a first external electrode, with the aid of which the first internal electrode 7 can be electrically contacted. The region 10 of the first internal electrode 7 is, in particular, configured in such a manner that further contacting elements can be soldered on here, via which the piezoelectric transformer 1 can be connected to a driver circuit.

Furthermore, a region 11 of the second internal electrode 9 is also arranged on the external surface of the input region 4. This region 11 of the second internal electrode 9 has also been reinforced in its thickness, and forms a second external electrode, with the aid of which the second internal electrode 9 can be electrically contacted. In particular, the reinforced region 11 of the second internal electrode 9 is configured in such a manner that contacting elements can likewise be soldered on here, via which the piezoelectric transformer 1 can be connected to a driver circuit.

In FIG. 1 it is shown that the external electrodes formed by regions 1o, 11 each extend over one half of the periphery of the input region 4. The contacting of the external electrodes can be effected by clamping, soldering or another procedure.

The output region 5 comprises a single piezoelectric layer 12 which has been completely polarized in a single direction of polarization. The piezoelectric layer 12 of the output region 5 has been polarized in the longitudinal direction L. Accordingly, the output region 5 is configured to convert a mechanical vibration in the longitudinal direction L into an electrical voltage.

Now if in the input region 4 a mechanical wave is excited which propagates into the output region 5, then as a consequence of the piezoelectric effect an electrical voltage is generated in the piezoelectric layer 12 of the output region 5. It may be a question, in particular, of a high voltage. At an end face 13 of the output region 5 that faces away from the input region 4, a high voltage in relation to a neighborhood of the piezoelectric transformer 1 is then available. If the piezoelectric transformer 1 is being used in an apparatus for generating a plasma, the plasma is ignited at this end face 13 of the output region 5, since the highest electrical voltage in relation to the neighborhood is available here.

In particular, the output region 5 does not comprise any sharp edges that extend in the longitudinal direction L. Otherwise, local field escalations could occur at such edges, which would lead to uncontrolled plasma discharges. By reason of the cylindrical design of the output region 5, an external surface of the output region 5 extending in the longitudinal direction is free from edges. Therefore the highest electric potential is available at the end face 13. Accordingly, plasma discharges, which can be utilized in desired manner in a plasma generator, occur at the end face 13.

The base body 2 has a hollow-cylindrical shape. In particular, both the input region 4 and the output region 5 have a hollow-cylindrical shape.

Figure 2:
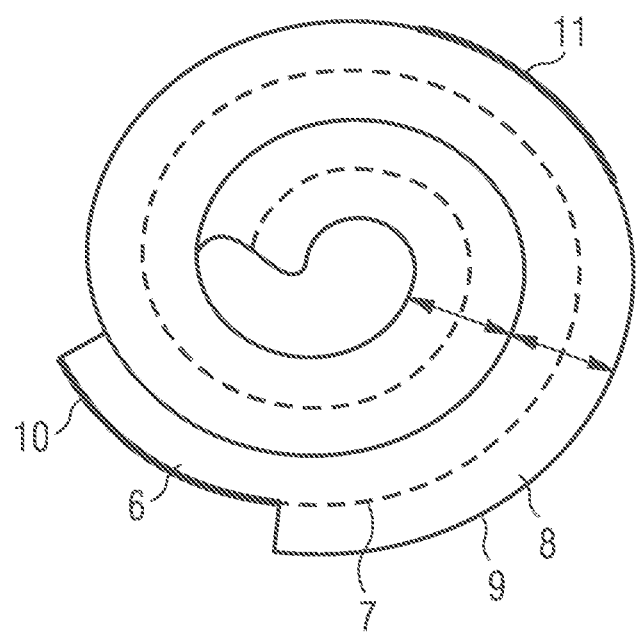
FIG. 2 shows a cross-section through a hollow-cylindrical piezoelectric transformer.

FIG. 2 shows a cross-section through the input region 4 of a hollow-cylindrical piezoelectric transformer 1 in a sectional plane perpendicular to the longitudinal direction L. The directions of polarization of the first and second piezoelectric layers 6, 8 are indicated here by arrows. The transformer 1 represented in FIG. 2 differs from the transformer shown in FIG. 1 merely in the extent of the reinforced regions 10, 11. The reinforced regions here each cover only an azimuthal extent that lies within a range between 30° and 60°.

The piezoelectric transformer 1 with the hollow-cylindrical shape shown in FIGS. 1 and 2 is manufactured as follows. Onto a first ceramic film, which later forms the first piezoelectric layer 6, a paste is applied which will form the first internal electrode 7 in the piezoelectric transformer 1. The paste is likewise applied onto a second ceramic film which later forms the second piezoelectric layer 8; the paste here will form the second internal electrode 9.

The two films are placed one above the other and wound onto a mandrel. The films are dimensioned in such a manner that both a region 10 of the first internal electrode 7 and a region 11 of the second internal electrode 9 are arranged on the external surface of the wound body. This arrangement can be obtained by means of films of different length, for instance.

In this state the piezoelectric transformer 1 is subjected to further processing. A compaction in the green state can be effected either by isostatic pressing onto the mandrel or by pressureless lamination with a pasty intermediate layer. In further process steps, the transformer can be debound and sintered. Later the mandrel is removed, so that in the internal region of the base body 2 a cylindrical opening 14 results which extends in the longitudinal direction L. A thin carrier film, which can facilitate the removal of the mandrel in the course of separating the piezoelectric transformer 1 from the mandrel, may possibly have been wound on the mandrel. The carrier film is likewise separated from the piezoelectric transformer 1 in the course of removing the mandrel.

By reason of the winding onto the mandrel, the production method described herein can be implemented quickly and with little effort.

Figure 3:
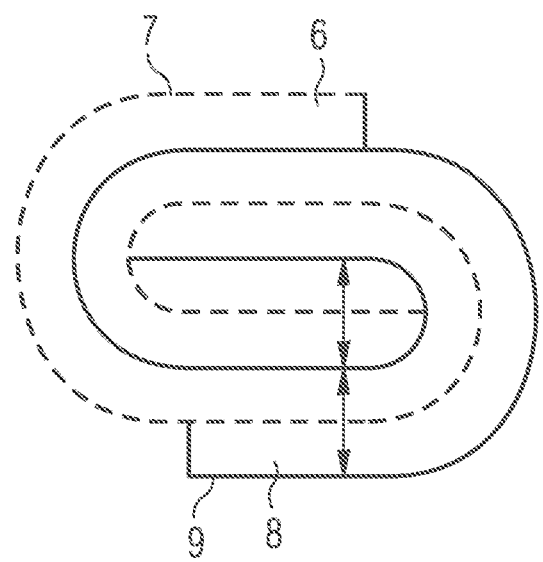
FIG. 3 shows a cross-section through a piezoelectric transformer according to a second embodiment.
Figure 4:
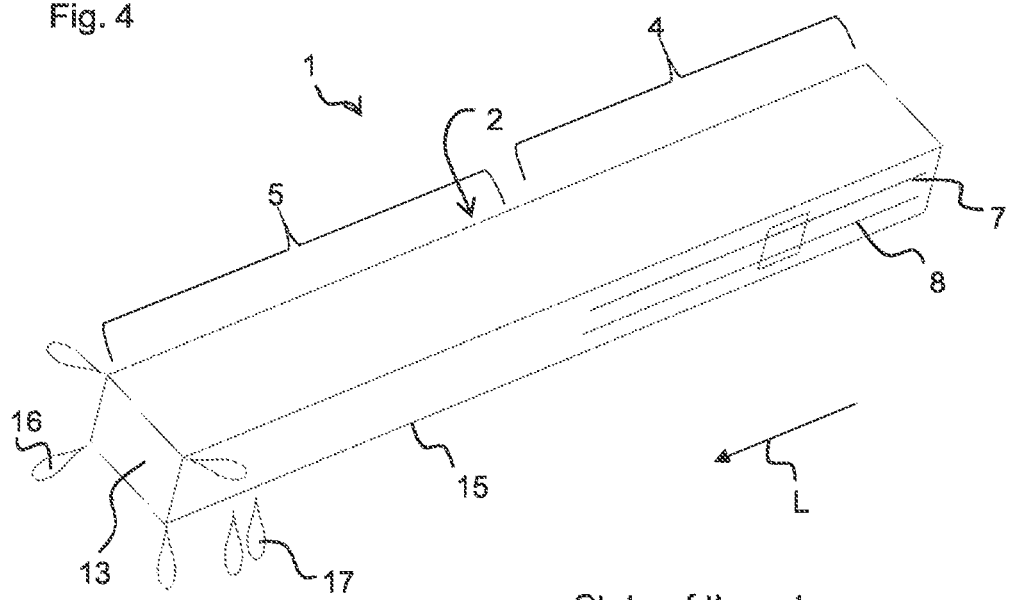
FIG. 4 shows a piezoelectric transformer known in the state of the art.

FIG. 3 shows a cross-section through the input region 4 of a piezoelectric transformer 1 according to a second embodiment. The piezoelectric transformer 1 according to the second embodiment differs from the first embodiment shown in FIG. 1 in that the base body 2 has a solid-cylindrical shape. In particular, both the input region 4 and the output region 5 have the shape of a solid cylinder.

The solid-cylindrical piezoelectric transformer 1 can achieve, with a smaller diameter, a capacitance between the first and second internal electrodes 7, 9 that corresponds to the capacitance of the hollow-cylindrical piezoelectric transformer 1. Therefore the second embodiment is suitable, in particular, in the case of applications that make stringent demands as regards the space requirement of the transformer 1.

The piezoelectric transformer 1 can be employed for generating plasma by ionization of a process gas, or for generating ozone, in the course of which air is ionized.

The invention claimed is:

1. A piezoelectric transformer comprising:
a cylindrical base body with an input region and an output region,
wherein a cylinder axis of the base body extends in a longitudinal direction,
wherein the input region is configured to convert an AC voltage into a mechanical vibration,
wherein the output region is configured to convert the mechanical vibration into an electrical voltage,
wherein the output region comprises a single piezoelectric layer polarized in the longitudinal direction,
wherein, in the input region, a first piezoelectric layer, on which a first internal electrode is arranged, and a second piezoelectric layer, on which a second internal electrode is arranged, are wound onto one another, and
wherein the first piezoelectric layer and the second piezoelectric layer are polarized in a radial direction which is perpendicular to the longitudinal direction.

2. The piezoelectric transformer as claimed in claim 1, wherein the output region is configured to generate a high voltage between an end face of the output region pointing away from the input region and a neighborhood of the piezoelectric transformer.

3. The piezoelectric transformer as claimed in claim 1, wherein the output region directly adjoins the input region in the longitudinal direction.

4. The piezoelectric transformer as claimed in claim 1, wherein the piezoelectric layer of the output region directly adjoins the first piezoelectric layer and the second piezoelectric layer of the input region.

5. The piezoelectric transformer as claimed in claim 1, wherein the first piezoelectric layer of the input region and the second piezoelectric layer of the input region are polarized in mutually opposed radial directions.

6. The piezoelectric transformer as claimed in claim 1, wherein the base body has a hollow-cylindrical shape.

7. The piezoelectric transformer as claimed in claim 1, wherein the base body has a solid-cylindrical shape.

8. The piezoelectric transformer as claimed in claim 1, wherein the layers of the input region are wound such that the first internal electrode is partially exposed on an external surface of the input region and that the second internal electrode is partially exposed on an external surface of the input region.

9. The piezoelectric transformer as claimed in claim 1,
wherein the first internal electrode comprises a region that is exposed on an external surface of the input region and that is reinforced in its thickness, and
wherein the second internal electrode comprises a region that is exposed on the external surface of the input region and that is reinforced in its thickness.

10. The piezoelectric transformer as claimed in claim 1, wherein the piezoelectric transformer is a Rosen type transformer.

11. An apparatus for generating a plasma comprising the piezoelectric transformer as claimed in claim 1.

* * * * *